(12) United States Patent
Chen

(10) Patent No.: US 12,724,039 B2
(45) Date of Patent: Sep. 1, 2026

(54) TESTING EQUIPMENT AND ADAPTER

(71) Applicant: NANYA TECHNOLOGY CORPORATION, New Taipei city (TW)

(72) Inventor: Yuan Chen, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 131 days.

(21) Appl. No.: 18/424,251

(22) Filed: Jan. 26, 2024

(65) Prior Publication Data

US 2025/0244360 A1 Jul. 31, 2025

(51) Int. Cl.
*G01R 1/073* (2006.01)
*G01R 1/04* (2006.01)

(52) U.S. Cl.
CPC ....... *G01R 1/0416* (2013.01); *G01R 1/07378* (2013.01)

(58) Field of Classification Search
None
See application file for complete search history.

(56) References Cited

U.S. PATENT DOCUMENTS 4,266,191 A * 5/1981 Spano ................ G01R 31/2887 324/754.03
4,701,781 A * 10/1987 Sankhagowit .......... H01L 22/32 361/813
4,840,570 A * 6/1989 Mann, Jr. ............. H05K 7/1461 439/372
5,563,509 A * 10/1996 Small ................. G01R 31/2886 324/756.07
6,004,142 A 12/1999 Gehman et al.
6,133,745 A * 10/2000 Yoon .................... G01R 1/0408 361/801
6,822,469 B1 * 11/2004 Kline ................... G01R 1/0408 324/759.03
6,969,266 B2 * 11/2005 Chu ..................... G01R 1/0433 439/70
7,038,474 B2 * 5/2006 McGinnis ............ G01R 31/311 324/762.01
7,132,841 B1 * 11/2006 Bertin .............. G11C 29/56016 257/E21.526
7,327,151 B2 * 2/2008 Kang ..................... G11C 29/56 324/762.01
7,495,464 B2 * 2/2009 Miyazaki ........... G01R 31/2889 324/762.01
8,972,633 B2 * 3/2015 Karamcheti ............ G06F 13/12 710/62
9,562,942 B2 * 2/2017 Shinohara ............ G01R 1/0491
2019/0174618 A1 * 6/2019 Chen ....................... G06F 1/185
2020/0088787 A1 3/2020 Ochotorena, Jr. et al.
2024/0183895 A1 * 6/2024 Lee .................... G01R 31/2893

* cited by examiner

*Primary Examiner* — Richard Isla
(74) *Attorney, Agent, or Firm* — CKC & Partners Co., LLC

(57) ABSTRACT

A testing equipment includes a tester, a load board and an adapter. The load board is disposed on the tester. The adapter is disposed on the load board and configured to support a device under test. The adapter is electrically connected to the load board and the device under test. The tester is configured to transmit a testing signal to the device under test and receive a feedback signal from the device under test through the load board and the adapter.

17 Claims, 6 Drawing Sheets

SF
120
A
A
200
PA

TESTING EQUIPMENT AND ADAPTER

BACKGROUND

Technical Field

The present disclosure relates to adapters and testing equipment installed with one of these adapters. More particularly, the present disclosure relates to adapters used for connecting with device under test to be tested by probes.

Description of Related Art

As the demand for electronic devices has been increasing nowadays, the quality of various components of electronic devices becomes an important issue of the industry. Apart from improving the technology of manufacture of the components, the accuracy of testing for the components has also become more important.

For example, probe stations are in general used to test the electrical behavior of electronic components in the industry. Hence, the standard of testing accuracy of probe stations is undoubtedly an important issue which the industry highly concerns.

SUMMARY

A technical aspect of the present disclosure is to provide a testing equipment, which can allow internal probing at high speeds during an electrical test to a device under test.

According to an embodiment of the present disclosure, a testing equipment includes a tester, a load board and an adapter. The load board is disposed on the tester. The adapter is disposed on the load board and configured to support a device under test. The adapter is electrically connected to the load board and the device under test. The tester is configured to transmit a testing signal to the device under test and receive a feedback signal from the device under test through the load board and the adapter.

In one or more embodiments of the present disclosure, the adapter includes a socket and a connecting plate. The socket is disposed on the load board and electrically connected with the load board. The connecting plate is detachably and electrically connected with the socket. The connecting plate defines a probe area away from the load board. The probe area is configured to place the device under test thereon. The connecting plate is electrically connected with the device under test.

In one or more embodiments of the present disclosure, the load board has a surface away from the tester. The socket is disposed on the surface. The connecting plate is connected with the socket along a direction intersecting with a normal of the surface.

In one or more embodiments of the present disclosure, the direction is perpendicular to the normal.

In one or more embodiments of the present disclosure, a vertical projection of the adapter to the load board is located within the surface.

In one or more embodiments of the present disclosure, the connecting plate includes a plate body, a plurality of conductive portions and a terminal portion. The probe area is located on the plate body. The conductive portions are located on the probe area and configured to electrically connect with the device under test. The terminal portion is connected with an edge of the plate body and electrically connected with the conductive portions. The terminal portion is configured to be inserted into and electrically connected with the socket.

In one or more embodiments of the present disclosure, at least one of the conductive portions is shaped as a line structure.

In one or more embodiments of the present disclosure, the conductive portions are separated from each other.

In one or more embodiments of the present disclosure, the connecting plate is at least partially parallel with the load board.

In one or more embodiments of the present disclosure, the adapter further includes a pair of guiding portions. The guiding portions are connected with two opposite ends of the socket. The guiding portions are configured to guide and hold the connecting plate therebetween.

In one or more embodiments of the present disclosure, the testing equipment further includes a frame, a platform, a probe holder and at least one probe. The frame defines an accommodation space. The tester and the load board are at least partially located in the accommodation space. The platform is connected with the frame. The platform has an opening communicated with the accommodation space. The adapter is exposed through the opening. The probe holder is disposed on the platform. The probe is held by the probe holder. The probe holder is configured to control the probe to contact with the device under test through the opening.

In one or more embodiments of the present disclosure, the testing equipment further includes a plurality of rollers. The rollers are connected to a side of the tester away from the load board.

In one or more embodiments of the present disclosure, the testing equipment further includes a microscope. The microscope slidably is connected with the platform and configured to obtain an image of the device under test.

In one or more embodiments of the present disclosure, the testing equipment further includes a display device. The display device is connected with the frame and signally connected with the microscope.

A technical aspect of the present disclosure is to provide an adapter, which can allow internal probing at high speeds during an electrical test to a device under test.

According to an embodiment of the present disclosure, an adapter includes a socket and a connecting plate. The socket is disposed on and electrically connected with a load board. The socket has an opening facing to a direction intersecting with a normal of the load board. The connecting plate is configured to be detachably inserted into the opening and electrically connected with the socket. The connecting plate defines a probe area away from the load board. The probe area is configured to place a device under test thereon. The connecting plate is electrically connected with the device under test.

In one or more embodiments of the present disclosure, the direction is perpendicular to the normal.

In one or more embodiments of the present disclosure, the connecting plate includes a plate body, a plurality of conductive portions and a terminal portion. The probe area is located on the plate body. The conductive portions are located on the probe area and configured to electrically connect with the device under test. The terminal portion is connected with an edge of the plate body and electrically connected with the conductive portions. The terminal portion is configured to be inserted into and electrically connected with the socket.

In one or more embodiments of the present disclosure, at least one of the conductive portions is shaped as a line structure.

In one or more embodiments of the present disclosure, the conductive portions are separated from each other.

In one or more embodiments of the present disclosure, the adapter further includes a pair of guiding portions. The guiding portions are connected with two opposite ends of the socket. The guiding portions are configured to guide and hold the connecting plate therebetween.

The above-mentioned embodiments of the present disclosure have at least the following advantages:

(1) The application of the adapter connected between the load board and the device under test allows internal probing at high speeds during an electrical test to the device under test.

(2) Since the connecting plate is at least partially parallel with the load board, an orientation of the device under test placed on the connecting plate is substantially held in a horizontal manner, which facilitates the application of probes on the device under test for testing.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
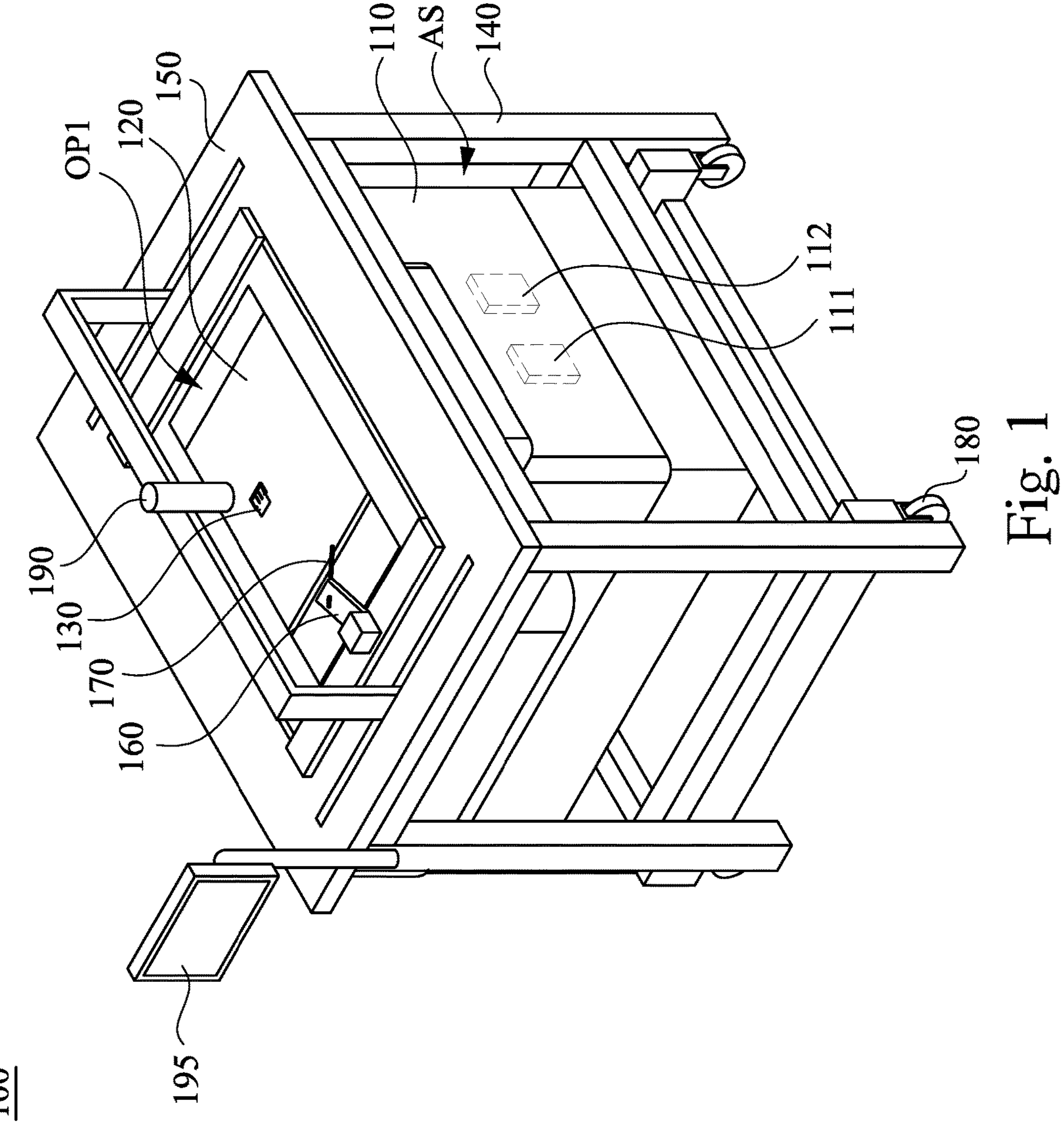
FIG. 1 is a schematic view of a testing equipment according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
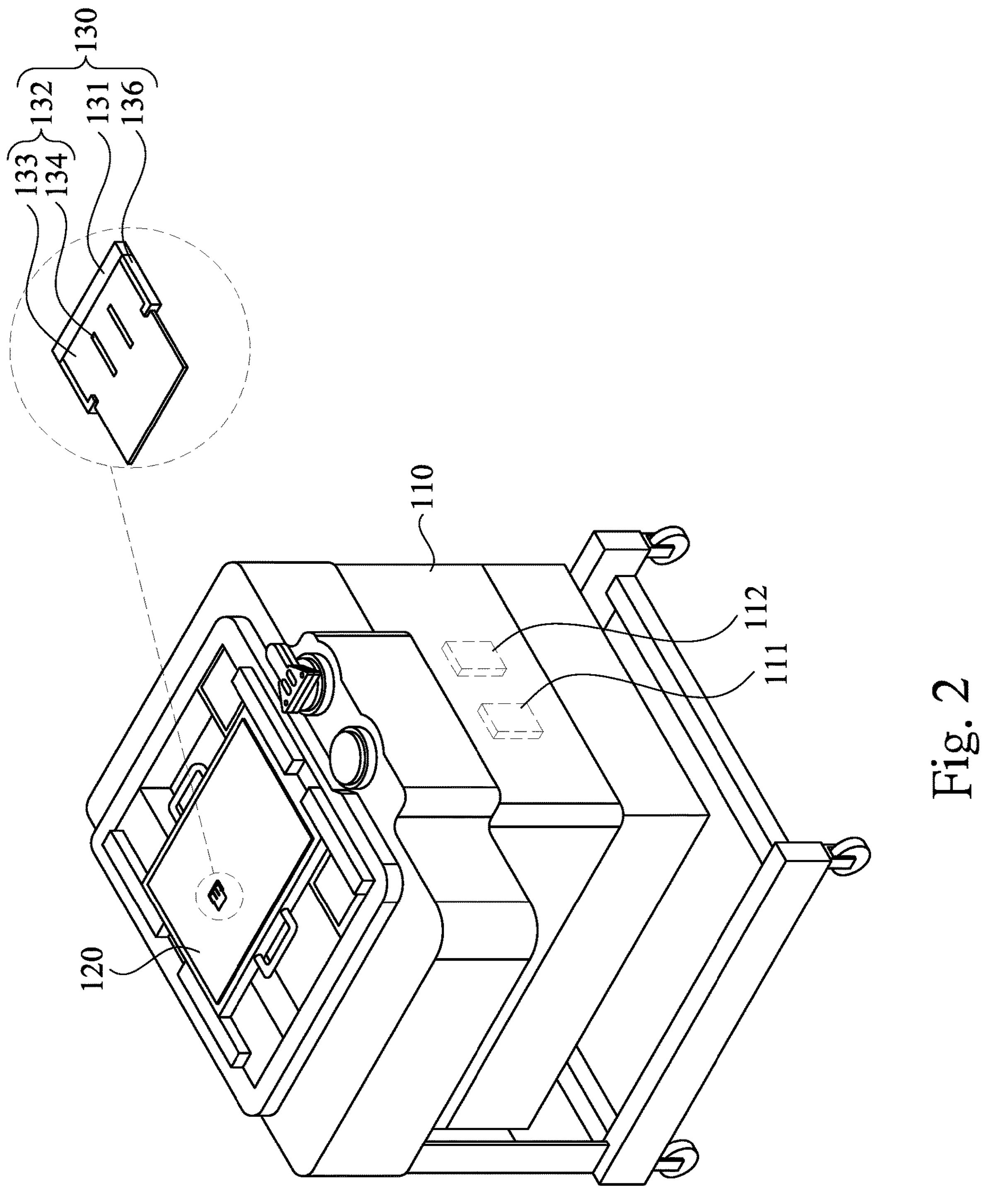
FIG. 2 is another schematic view of the testing equipment of FIG. 1, in which the frame, the platform, the probe holder and the probe are omitted.

Reference is made to FIGS. 1-2. FIG. 1 is a schematic view of a testing equipment 100 according to an embodiment of the present disclosure. FIG. 2 is another schematic view of the testing equipment 100 of FIG. 1, in which the frame 140, the platform 150, the probe holder 160 and the probe 170 are omitted. In this embodiment, as shown in FIGS. 1-2, a testing equipment 100 includes a tester 110, a load board 120 and an adapter 130. The load board 120 is disposed on the tester 110 and is practically a circuit board. The adapter 130 is disposed on the load board 120 and configured to support a device under test 200 (please see FIGS. 5-6 for the device under test 200). The adapter 130 is electrically connected to the load board 120 and the device under test 200. In practical applications, the tester 110 includes a transmitter 111 and a receiver 112. The transmitter 111 is configured to transmit a testing signal to the device under test 200 through the load board 120 and the adapter 130. The receiver 112 is configured to receive a feedback signal from the device under test 200 through the load board 120 and the adapter 130. For example, the tester 110 is a high-speed memory tester while the device under test 200 is a memory card, such as a dynamic random-access memory (DRAM).

As mentioned above, since the adapter 130 is electrically connected to the load board 120 and the device under test 200, transmission lines will not be required to connect between the load board 120 and the device under test 200. In this way, the limitation to the testing speed due to the presence of transmission lines can be avoided. On the contrary, the application of the adapter 130 connected between the load board 120 and the device under test 200 allows internal probing at high speeds during an electrical test to the device under test 200.

Furthermore, as shown in FIG. 1, the testing equipment 100 further includes a frame 140, a platform 150, a probe holder 160 and at least one probe 170. The frame 140 defines an accommodation space AS. The tester 110 and the load board 120 are at least partially located in the accommodation space AS defined by the frame 140. The platform 150 is connected with the frame 140. The platform 150 has an opening OP1 communicated with the accommodation space AS defined by the frame 140. The adapter 130 is exposed through the opening OP1 of the platform 150. The probe holder 160 is disposed on the platform 150. The probe 170 is held by the probe holder 160. The probe holder 160 is configured to control the probe 170 to contact with the device under test 200 through the opening OP1 of the platform 150. For the sake of drawing simplification, the frame 140, the platform 150, the probe holder 160 and the probe 170 are omitted in FIG. 2.

In addition, as shown in FIG. 1, the testing equipment 100 further includes a plurality of rollers 180. The rollers 180 are connected to a side of the tester 110 away from the load board 120. Each of the rollers 180 is configured to roll over a floor. In this way, a user can move the tester 110 between different working locations in an effective and easy manner.

Moreover, as shown in FIG. 1, the testing equipment 100 further includes a microscope 190 and a display device 195. The microscope 190 slidably is connected with the platform 150 and configured to obtain an image of the device under test 200 through the opening OP1 of the platform 150. The display device 195 is connected with the frame 140 and signally connected with the microscope 190. In this way, the image obtained by the microscope 190 can be displayed on the display device 195.

Figure 3:
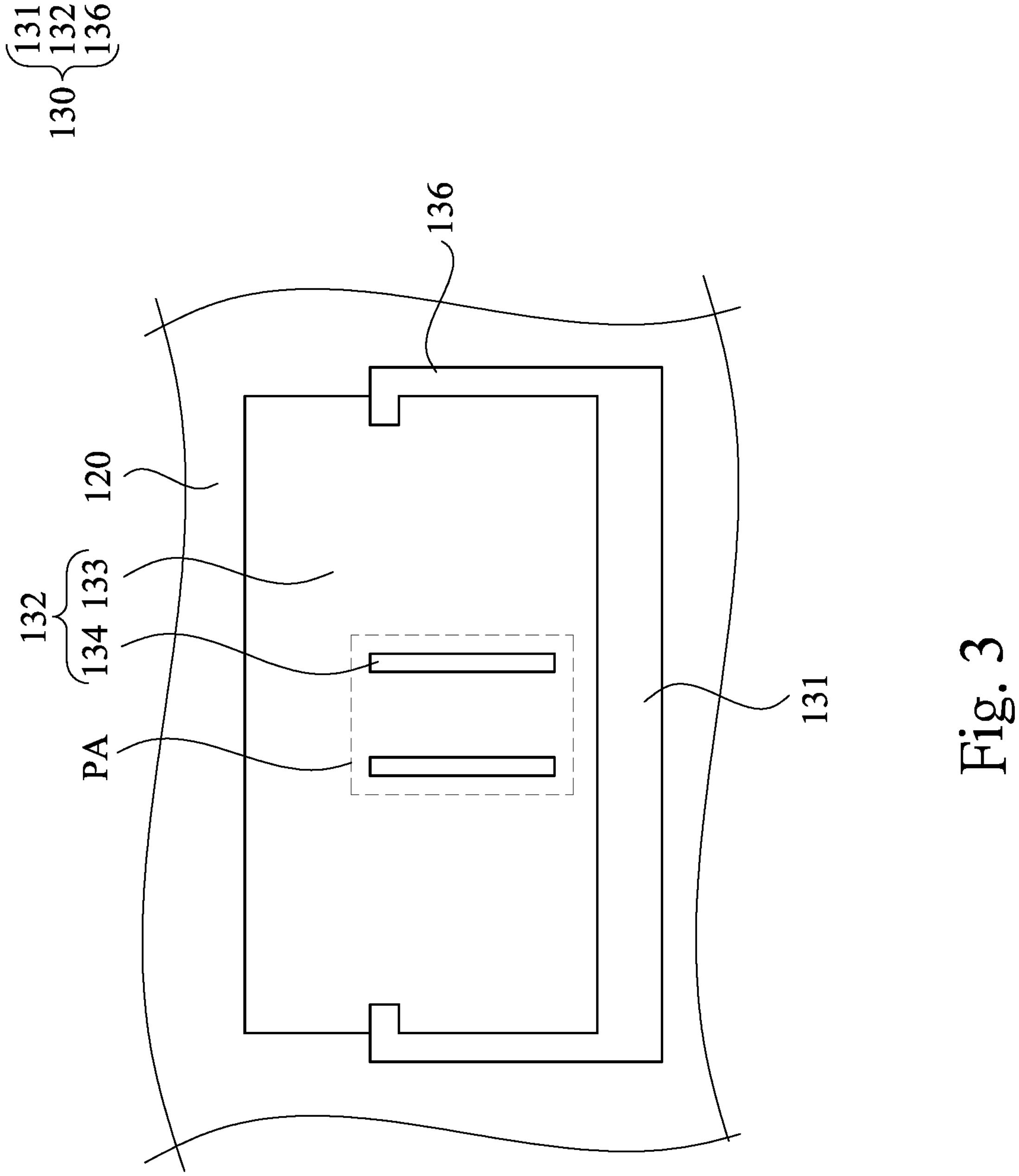
FIG. 3 is a top view of the adapter of FIGS. 1-2.

Reference is made to FIG. 3. FIG. 3 is a top view of the adapter 130 of FIGS. 1-2. In this embodiment, as shown in FIGS. 2-3, the adapter 130 includes a socket 131 and a connecting plate 132. The socket 131 is disposed on the load board 120 and electrically connected with the load board

120. The connecting plate 132 is detachably and electrically connected with the socket 131. The connecting plate 132 defines a probe area PA (please see FIG. 3 for the probe area PA) located away from the load board 120. The probe area PA is configured to place the device under test 200 thereon, and the connecting plate 132 is electrically connected with the device under test 200.

To be specific, as shown in FIGS. 2-3, the connecting plate 132 includes a plate body 133 and a plurality of conductive portions 134. The probe area PA is located on the plate body 133. The conductive portions 134 are located on the probe area PA and configured to electrically connect with the device under test 200. In other words, the conductive portions 134 serve as electrical contact points to contact with the device under test 200.

Moreover, in this embodiment, at least one of the conductive portions 134 is shaped as a line structure. For example, as shown in FIGS. 2-3, both of the conductive portions 134 are respectively shaped as a line structure. In addition, the conductive portions 134 are separated from each other in the probe area PA.

Figure 4:
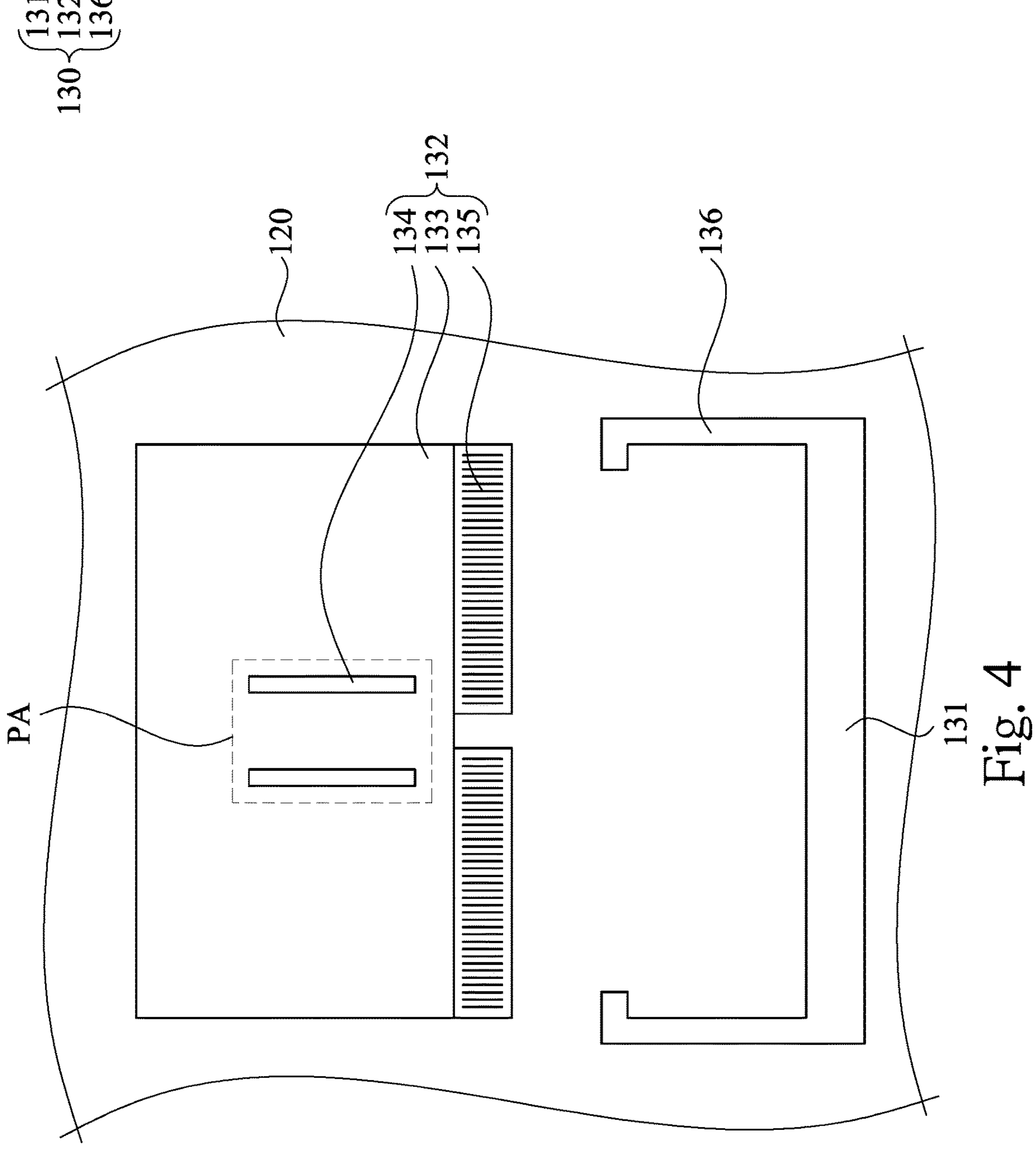
FIG. 4 is a top view of the adapter of FIG. 3, in which the connecting plate is detached from the socket.

Reference is made to FIG. 4. FIG. 4 is a top view of the adapter 130 of FIG. 3, in which the connecting plate 132 is detached from the socket 131. In this embodiment, as shown in FIG. 4, the connecting plate 132 further includes a terminal portion 135. The terminal portion 135 is connected with an edge of the plate body 133 and electrically connected with the conductive portions 134. The terminal portion 135 is configured to be inserted into the socket 131, such that the terminal portion 135 is electrically connected with the socket 131.

Furthermore, as shown in FIGS. 2-4, the adapter 130 further includes a pair of guiding portions 136. The guiding portions 136 are connected with two opposite ends of the socket 131. The guiding portions 136 are configured to guide and hold the connecting plate 132 therebetween.

Figure 5:
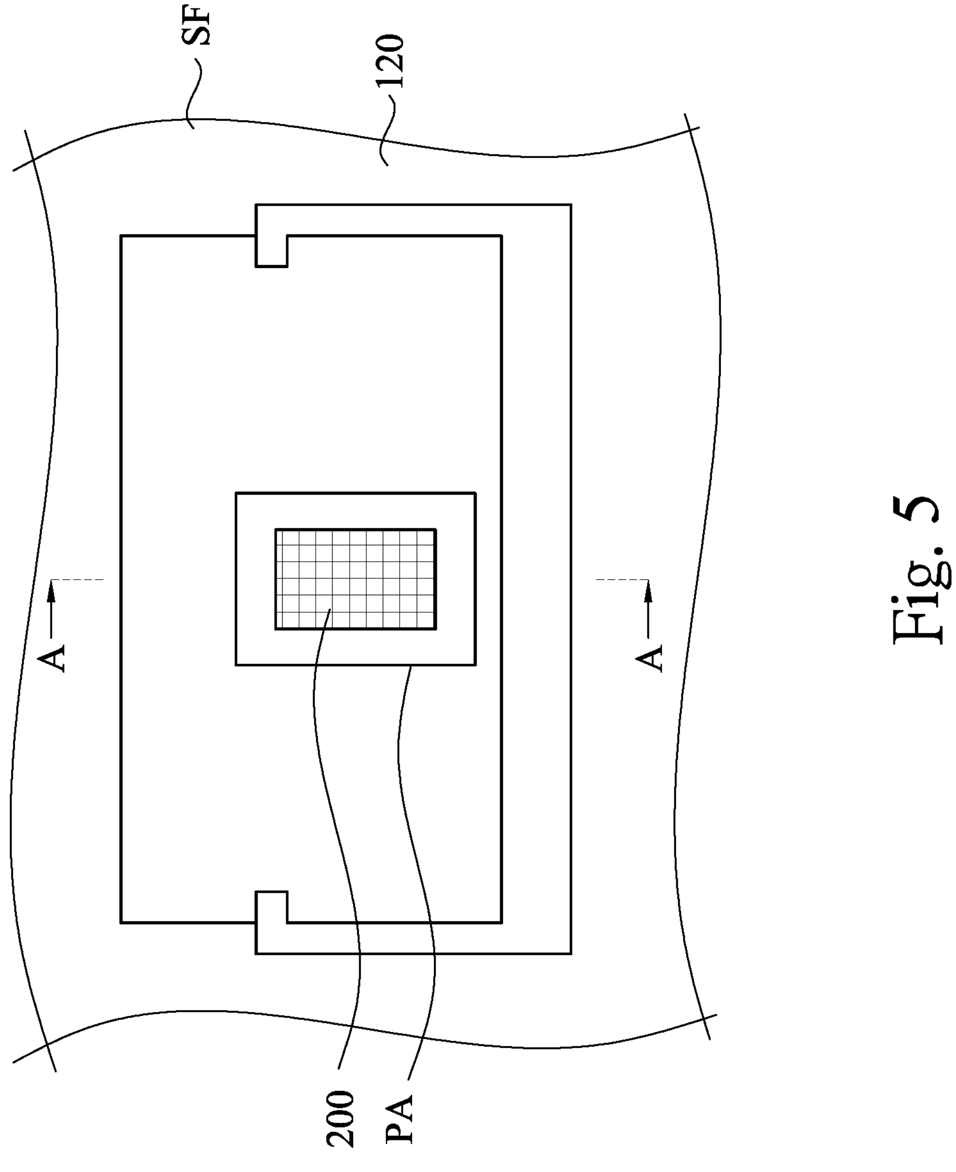
FIG. 5 is a top view of the adapter of FIG. 3, in which the device under test is placed on the probe area.
Figure 6:
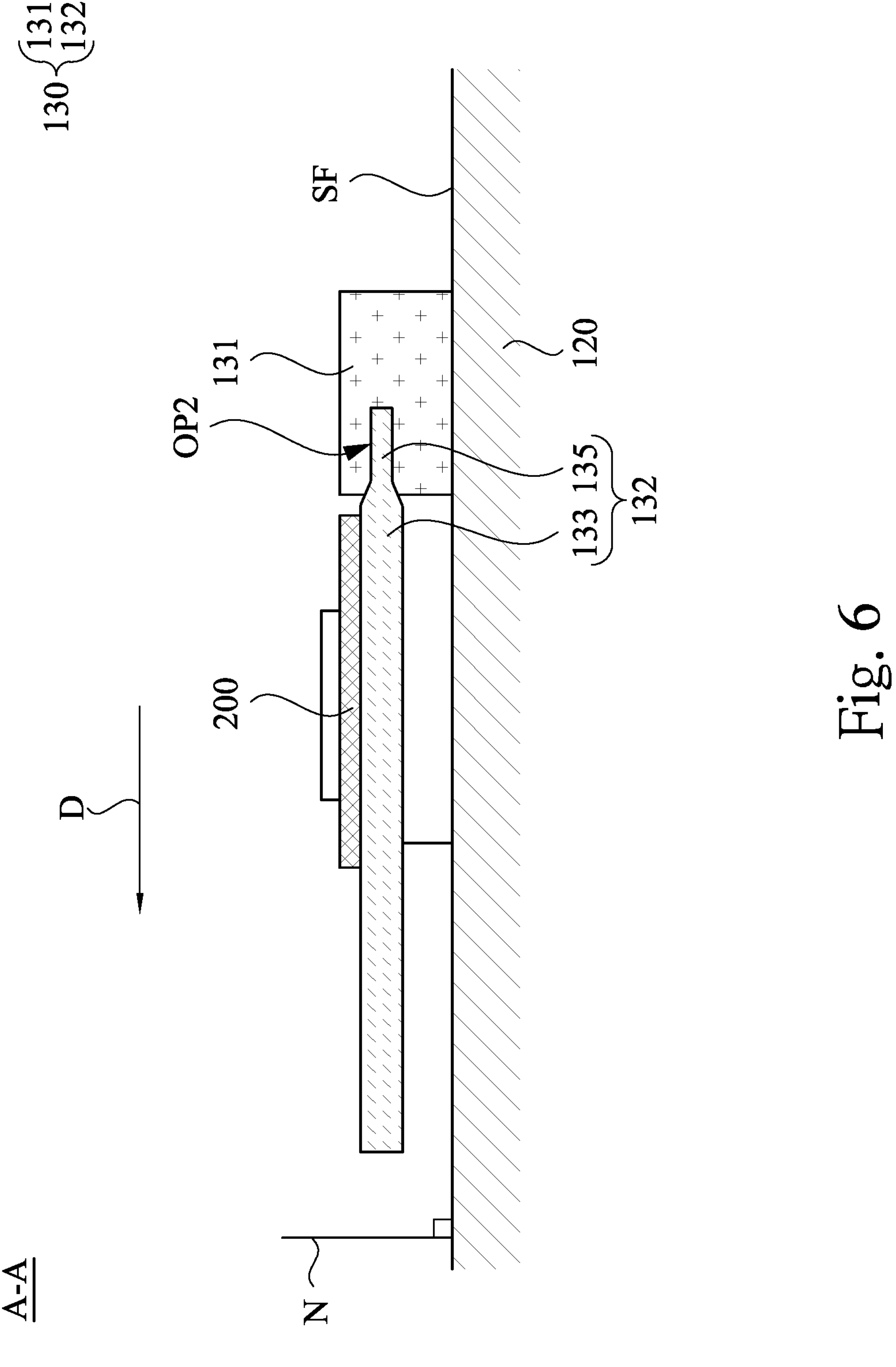
FIG. 6 is a cross-sectional view along the section line A-A of FIG. 5.

Reference is made to FIGS. 5-6. FIG. 5 is a top view of the adapter 130 of FIG. 3, in which the device under test 200 is placed on the probe area PA. FIG. 6 is a cross-sectional view along the section line A-A of FIG. 5. In this embodiment, as shown in FIGS. 5-6, the load board 120 has a surface SF away from the tester 110 (please see FIGS. 1-2 for the tester 110). The socket 131 is disposed on the surface SF of the load board 120. The socket 131 has an opening OP2 (please see FIG. 6 for the opening OP2) facing to a direction D intersecting with a normal N of the load board 120, and the connecting plate 132 is detachably inserted into the opening OP2, such that the connecting plate 132 is connected with the socket 131 along the direction D to form an electrical connection. In practical applications, the direction D is perpendicular to the normal N of the load board 120 and is parallel with the surface SF.

In addition, as shown in FIGS. 1-3 and 5-6, a vertical projection of the adapter 130 to the load board 120 is located within the surface SF. In other words, the size of the adapter 130 is smaller than the load board 120 as viewed along the normal N of the surface SF.

Furthermore, as shown in FIG. 6, the connecting plate 132 is at least partially parallel with the load board 120. In this way, an orientation of the device under test 200 placed on the connecting plate 132 is substantially held in a horizontal manner, which facilitates the application of the probe 170 (please see FIG. 1 for the probe 170) on the device under test 200 for testing.

In conclusion, the aforementioned embodiments of the present disclosure have at least the following advantages:

(1) The application of the adapter connected between the load board and the device under test allows internal probing at high speeds during an electrical test to the device under test.

(2) Since the connecting plate is at least partially parallel with the load board, an orientation of the device under test placed on the connecting plate is substantially held in a horizontal manner, which facilitates the application of probes on the device under test for testing.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A testing equipment, comprising:
- a tester;
- a load board disposed on the tester; and
- an adapter, comprising:
  - a socket directly disposed on the load board and electrically connected with the load board; and
  - a connecting plate directly, detachably and electrically connected with the socket and configured to support a device under test, the connecting plate being electrically connected to the device under test, the connecting plate being spaced apart from and parallel with the load board;
- a frame defining an accommodation space, the tester and the load board being at least partially located in the accommodation space;
- a platform connected with the frame, the platform having an opening communicated with the accommodation space, the adapter being exposed through the opening;
- a probe holder disposed on the platform; and
- at least one probe held by the probe holder, the probe holder being configured to control the probe to contact with the device under test through the opening,
- wherein the tester is configured to transmit a testing signal to the device under test and receive a feedback signal from the device under test through the load board and the adapter.

2. The testing equipment of claim 1, wherein the connecting plate defines a probe area away from the load board, the probe area is configured to place the device under test thereon.

3. The testing equipment of claim 2, wherein the load board has a surface away from the tester, the socket is disposed on the surface, the connecting plate is connected with the socket along a direction intersecting with a normal of the surface.

4. The testing equipment of claim 3, wherein the direction is perpendicular to the normal.

5. The testing equipment of claim 3, wherein a vertical projection of the adapter to the load board is located within the surface.

6. The testing equipment of claim 2, wherein the connecting plate comprises:
- a plate body, the probe area is located on the plate body;

a plurality of conductive portions located on the probe area and configured to electrically connect with the device under test; and a terminal portion connected with an edge of the plate body and electrically connected with the conductive portions, the terminal portion is configured to be inserted into and electrically connected with the socket.

7. The testing equipment of claim 6, wherein at least one of the conductive portions is shaped as a line structure.

8. The testing equipment of claim 6, wherein the conductive portions are separated from each other.

9. The testing equipment of claim 2, wherein the adapter further comprises:

a pair of guiding portions connected with two opposite ends of the socket, the guiding portions are configured to guide and hold the connecting plate therebetween.

10. The testing equipment of claim 1, further comprising:

a plurality of rollers connected to a side of the tester away from the load board.

11. The testing equipment of claim 1, further comprising:

a microscope slidably connected with the platform and configured to obtain an image of the device under test.

12. The testing equipment of claim 11, further comprising:

a display device connected with the frame and signally connected with the microscope.

13. An adapter, comprising:

a socket disposed on and electrically connected with a load board, the socket having an opening facing to a direction intersecting with a normal of the load board;

a connecting plate comprising:

a plate body configured to be detachably inserted into the opening and electrically connected with the socket, the plate body defining a probe area away from the load board, the probe area being configured to place a device under test thereon, the plate body being electrically connected with the device under test; and a plurality of conductive portions located on the probe area and configured to electrically connect with the device under test; and a pair of guiding portions fixed to two opposite ends of the socket with a constant interval therebetween, the guiding portions being configured to abut against outer edges of the plate body to guide and hold the plate body therebetween, the conductive portions being at least partially aligned between the guiding portions.

14. The adapter of claim 13, wherein the direction is perpendicular to the normal.

15. The adapter of claim 13, wherein the connecting plate further comprises:

a terminal portion connected with an edge of the plate body and electrically connected with the conductive portions, the terminal portion is configured to be inserted into and electrically connected with the socket.

16. The adapter of claim 13, wherein at least one of the conductive portions is shaped as a line structure.

17. The adapter of claim 13, wherein the conductive portions are separated from each other.

* * * * *